United States Patent [19]
Koike et al.

[11] Patent Number: 5,446,318
[45] Date of Patent: Aug. 29, 1995

[54] SEMICONDUCTOR MODULE WITH A PLURALITY OF POWER DEVICES MOUNTED ON A SUPPORT BASE WITH AN IMPROVED HEAT SINK/INSULATION PLATE ARRANGEMENT

[75] Inventors: Yoshihiko Koike; Ryuichi Saito; Sigeki Sekine; Yuuji Wakisawa, all of Hitachi, Japan

[73] Assignee: Hitachi, Ltd., Tokyo, Japan

[21] Appl. No.: 114,358

[22] Filed: Sep. 1, 1993

[30] Foreign Application Priority Data

Sep. 8, 1992 [JP] Japan .................... 4-239590

[51] Int. Cl.⁶ .......................................... H01L 23/02
[52] U.S. Cl. .................................. 257/707; 257/724
[58] Field of Search ............ 257/706, 707, 709, 722, 257/723, 724

[56] References Cited

U.S. PATENT DOCUMENTS 4,556,899 12/1985 Kurihara et al. ................ 757/706
5,291,065 3/1994 Arai et al. ........................ 257/691

FOREIGN PATENT DOCUMENTS

3241508C2 11/1982 Germany .
4020577A1 6/1990 Germany .
57-160150 10/1982 Japan .
60-257141 12/1985 Japan .
2-77143 3/1990 Japan .

*Primary Examiner*—Edward Wojciechovicz
*Assistant Examiner*—S. V. Clark
*Attorney, Agent, or Firm*—Antonelli, Terry, Stout & Kraus

[57] ABSTRACT

A semiconductor module having heat sink plates and an insulating plate laminated under the semiconductor chips, wherein the thickness of the support base plate is set to be 2.5 times in thickness of the insulating plate, which is the maximum thickness among the heat sink plates and the insulating plate laminated in the semiconductor module, so that the thermal fatigue lives of the solder layers are balanced, and the life of the whole semiconductor module can be prolonged.

26 Claims, 6 Drawing Sheets

SEMICONDUCTOR MODULE WITH A PLURALITY OF POWER DEVICES MOUNTED ON A SUPPORT BASE WITH AN IMPROVED HEAT SINK/INSULATION PLATE ARRANGEMENT

CROSS-REFERENCE TO RELATED APPLICATION

The application relates to U.S. patent application Ser. No. 07/947,544 filed on Sep. 21, 1992 entitled "POWER CONVERSION DEVICE AND SEMICONDUCTOR MODULE SUITABLE FOR USE IN THE DEVICE", by Matsuhiro MORI, et al. and assigned to the present assignee.

BACKGROUND OF THE INVENTION

This invention relates to a semiconductor device and more particularly to the structure of a power semiconductor module having a plurality of power devices mounted on a substrate and sealed in an insulating package.

As is well known, there are power semiconductor modules having power semiconductor switching devices, such as IGBTs, GTOs, or power transistors, sealed in insulating packages. Each of those power semiconductor modules is formed by laminating a base plate an internal heat sink plate for dispersing the heat generated in the semiconductor chips, and insulating plates for electrically insulating the semiconductor chips and the above-mentioned base plate in the module, and also by joining those plates with a solder or a brazing alloy. The final cooling of the power semiconductor modules is implemented by cooling fins or heat pipes attached to the base plate.

In a power semiconductor module structured as described, the temperature of the whole semiconductor module changes with the switching condition. Even in the power semiconductor module, temperature differences occur between the layers placed between the semiconductor chips and the support base plate. The life of the power semiconductor module is determined by a phenomenon that cracks due to the thermal fatigue attributable to the above-mentioned temperature change of whole module and temperature difference within the module occur in the solder or brazing material bonding the component parts together, so that the thermal resistance of the solder or the brazing material rises.

In order to extend the life of the power semiconductor module, JP-A-60-257141 proposes a structure in which the thermal stress buffer plates are thicker than the terminal plates in a semiconductor device having the insulating plates, terminal plates, thermal stress buffer plates, and semiconductor chips successively fixed to the metal base by solder.

On the other hand, JP-A-61-237456 discloses a structure in which the linear expansion coefficient and the Young's modulus of each internal heat sink plate are limited to certain values to thereby suppress the thermal fatigue of each solder layer in a semiconductor device having a semiconductor substrate is bonded to a metal substrate with interposition of an auxiliary metal substrate and an insulating plate.

In the above-mentioned technique, when the structure of the power semiconductor module is to be optimized with a view to prolonging the solder life, since the thickness of some internal heat sink plates is fixed, the optimization was not sought sufficiently in respect of the mutual relation of the thickness of the individual internal heat sink plates.

Although the life prediction is usually performed in the case of heat cycle test, it is not provided for the power semiconductor modules using different plate thicknesses in the case of working condition where a temperature difference occurs inside the semiconductor module by turning on and off of the semiconductor chips.

SUMMARY OF THE INVENTION

It is therefore an object of this invention to provide a semiconductor module including a plurality of internal heat sink plates and/or an insulating plate (collectively referred to as support plates) bonded together by solder or metal brazing material, thereby having such a structure as to optimize the thermal fatigue life of each of the bonding layers and prolonging the life of the whole module.

To achieve the above object, this invention proposes a semiconductor module including a plurality of semiconductor chips, internal heat sink plates for supporting the semiconductor chips and an insulating plate bonded together by solder or metal brazing material, wherein the thickness of the base support plate is more than 2.5 times in maximum thickness of the internal support plates.

When a Mo heat sink plate is disposed under each of the above-mentioned plurality of the semiconductor chips and a single internal copper heat sink plate is disposed under those Mo plates, the thickness of the internal copper heat sink plate is more than twice in thickness of the Mo plates mentioned above.

This invention proposes a semiconductor module including a plurality of semiconductor chips, heat sink plates for supporting those semiconductor chips and an insulating plate stacked and bonded together by solder or metal brazing material, wherein an internal copper heat sink plate and a copper base plate each having different thicknesses are disposed above and below the insulating plate.

In any of the above-mentioned cases, the internal heat sink plate or the insulating plate may be warped so that the middle portion of the internal heat sink plate is curved toward the solder layer as the peripheral thickness of the solder layer is more than 1.5 times in thickness of the middle portion of the solder layer.

By forming plating layers on and beneath the insulating plate with the insertion of metallization patterns on both side of the insulating plate and bonding the heat sink plates respectively to the upper and lower plating layers with the insertion of solder layers over the plating layers, the areas of the plating layers can be made smaller than the areas of the heat sink plates disposed on and beneath the plating layers.

Further, Mo heat sink plates may be disposed beneath the semiconductor chips, a Cu heat sink plate disposed beneath the Mo heat sink plates, and Mo heat sink plate disposed on the side, which faces the support base plate of the Cu heat sink plate.

When the area of the support base plate is 40 $cm^2$ or more, the thickness of the above-mentioned support base plate is preferably 8 mm or more.

In any of the above-mentioned cases, the insulation distance between the anode and cathode terminals of semiconductor chips can be secured in the through-thickness direction of the insulating plates disposed beneath the terminal leads.

In this invention, since the thickness of the support base plate is specified as more than 2.5 times in maximum thickness in the heat sink plates laminated inside the semiconductor module, the life of the solder layers bonding the heat sink plates or insulating plates in the semiconductor module can be balanced, and the life of the whole semiconductor module can be prolonged.

Further, when the Mo plates are disposed beneath a plurality of semiconductor chips and a Cu heat sink plate is provided underneath, since the thickness of the Cu heat sink plate is specified as more than twice in thickness of the Mo plates, the lives of the solder layers for bonding the heat sink plates or insulating plates in the semiconductor module can be balanced and the life of the whole semiconductor module can be prolonged.

When the heat sink plates or insulating plates are warped so that the middle portions of the heat sink plates or insulating plates are warped toward the solder layers for bonding, and the peripheral portions of the solder layers are more than 1.5 times in thicknesses of the middle portions of the solder layers, the propagation of a crack in the peripheral portion of the solder layer can be suppressed effectively.

When the areas of the plating layers are set to be smaller than the areas of the heat sink plates disposed on and beneath the plating layers, a portion through which the residual gas can escape can be secured, so that the voids of the solder layer can be decreased.

Further, when the Mo heat sink plates are disposed beneath the semiconductor chips and a Cu heat sink plate is disposed beneath the Mo heat sink plates and a Mo heat sink plate is disposed on the support base plate side of the Cu heat sink plate, the amount of warpage at room temperature can be reduced.

When the area of the support base plate is 40 cm$^2$ or more, if the thickness of the final support plate is set to be 8 mm or more, it is possible to solve the problems, such as uneven mounting of the module to cooling fins or increase of thermal contact resistance resulting from the warpage of the support base plate.

When the insulation distance between the anode and cathode terminals of semiconductor chips is secured in the through-thickness direction of the insulating plate disposed beneath the terminal leads, the area of the semiconductor module can be decreased.

DESCRIPTION OF THE PREFERRED EMBODIMENTS

Embodiments of this invention will be described with reference to FIGS. 1 to 10. In the following description, the maximum thickness among heat sink plates inside a semiconductor module is represented by a reference thickness as 1, thereby each thickness of the heat sink plates is represented by a ratio with respect to the reference thickness.

Figure 1:
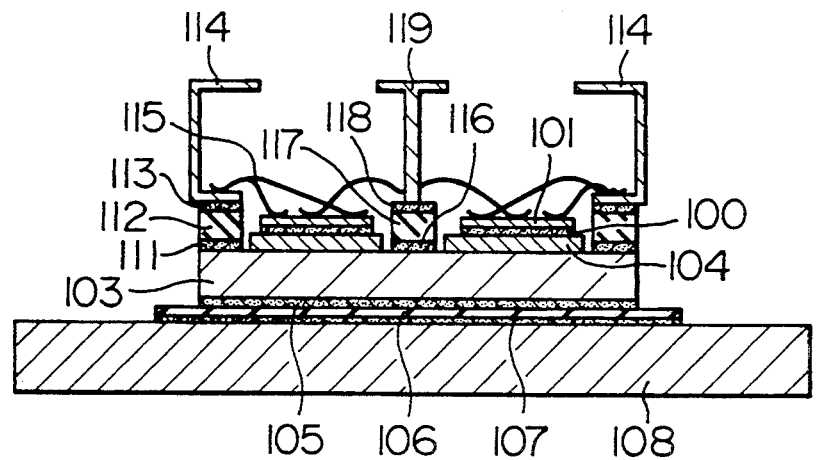
FIG. 1 is a sectional view showing the internal structure of an embodiment of the semiconductor module according to this invention.
Figure 2:
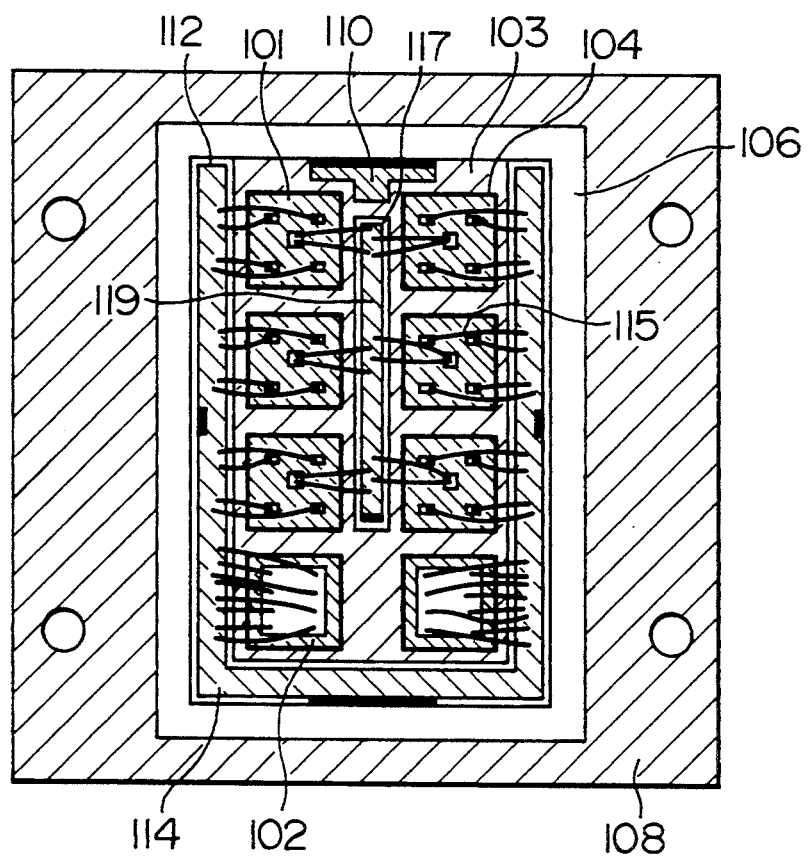
FIG. 2 is a plane view showing the internal arrangement of the semiconductor module in FIG. 1.

FIG. 1 is a sectional view showing the internal structure of an embodiment of the semiconductor module according to this invention. FIG. 2 is a plane view showing an internal arrangement of the semiconductor module in FIG. 1. In the embodiment of FIG. 1, the thickness of an internal heat sink plate 103 made of Cu, serving also as the collector electrode, is considered the reference thickness as 1, on which eight pieces of electrode Si chips in thickness of 0.1 are arranged dispersedly as shown in FIG. 2. Six pieces among the Si chips, are IGBT chips 101 and two pieces are diode chips 102.

The Si chips 101, 102 are bonded to the heat sink plate 103 by a solder layer 100. When the Si chips 101, 102 are bonded to the heat sink plate 103, heat sink plates 104 made of a Mo in a thickness of 0.43, for example, are interposed between the chips and the heat sink plate 103. The heat sink plate 103 is bonded by a solder layer 105 to an insulating plate 106 of $Al_2O_3$ in a thickness of 0.21. The insulating plate 106 is bonded by a solder layer 107 to a copper base 108 in a thickness of 3.33. The heat sink plate 103 also serving as the collector electrode is joined by a solder layer, not shown, to a collector terminal 110.

The emitter electrodes of the IGBT chips 101 and the anode electrodes of the diode chips 102 are joined to the emitter terminal 114 by Al wires 115. The emitter terminal 114 is joined by a solder layer 113 to the emitter terminal insulating plate 112 of $Al_2O_3$ in a thickness of 1.36, for example. The emitter terminal 112 is joined to the heat sink plate 103 as the collector electrode by a solder layer 111.

The gate electrodes of the IGBT chips 101 are joined to the gate terminal 119 by Al wires 115. The gate terminal 119 is bonded by a solder layer 118 to a gate terminal insulating plate 117 of $Al_2O_3$ in a thickness of 1.36, for example. The gate terminal insulating plate 117 is bonded to the plate 103 as a collector electrode by a solder layer 116.

In the semiconductor module in this embodiment, reason on which these plate thicknesses were determined will be described underneath.

Figure 3:
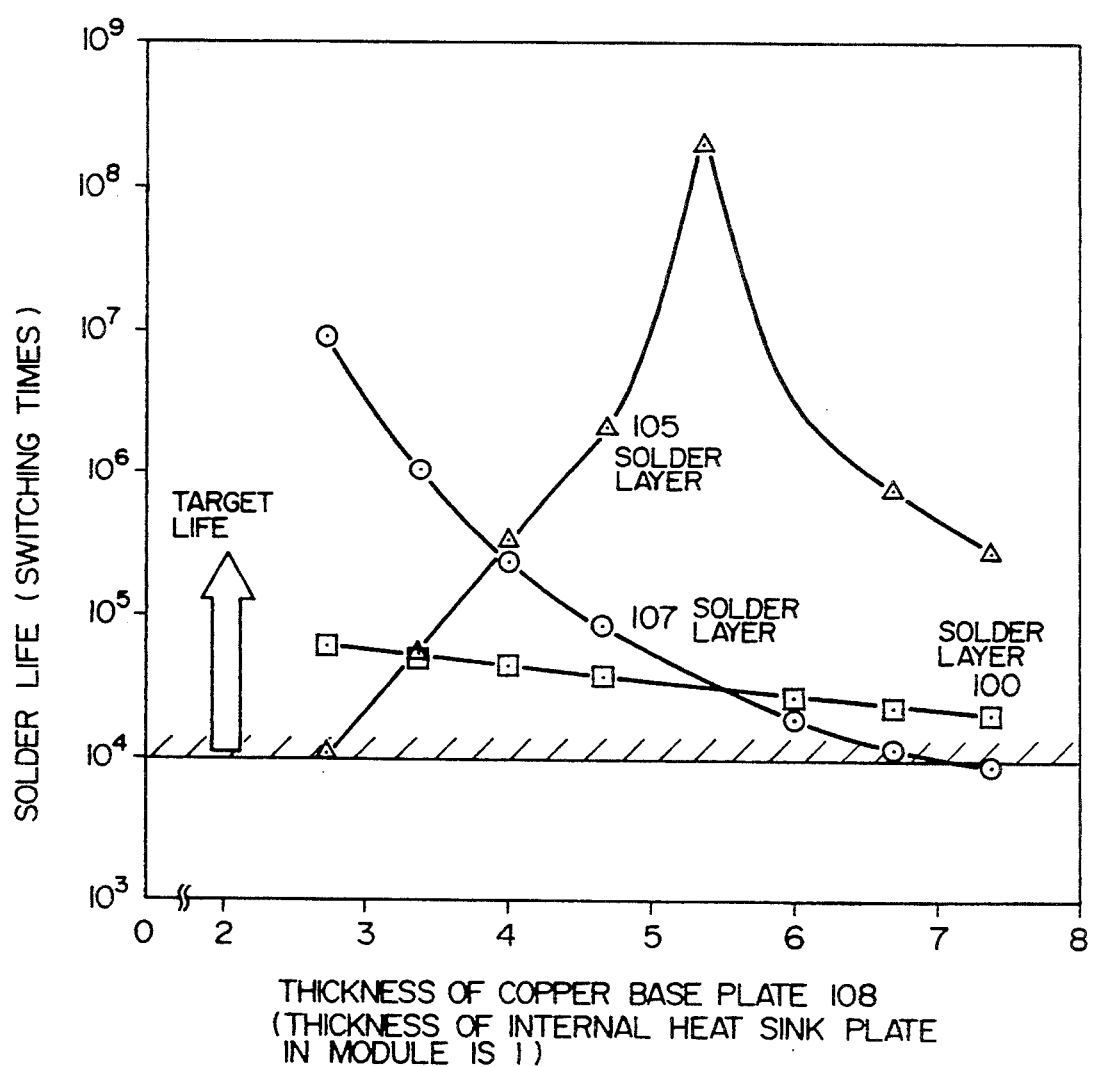
FIG. 3 is a diagram showing the relation between the thickness of the support base plate and the lives of the solder layers in thermal fatigue test performed in the embodiment in FIG. 1.

FIG. 3 is a diagram showing the relationship between the thickness of the copper base 108 and the lives of solder layers when thermal fatigue test was conducted on the embodiment in FIG. 1. More specifically, FIG. 3 shows the relationship between the copper base thickness and the life of each solder layer, which represents a result of carrying out the experiment in the case that the thickness of the heat sink plates 103, 104 or the insulating plate 106 other than the copper base 108 is a similar value to the thickness described in FIG. 1 for thermal fatigue test, that is, the Si chips are switched to the on state and the Si chip surfaces are heated up to 125° C., the Si chips are switched to the off state, and they are cooled, repeatedly.

When the thickness of the copper base 108 is varied, the lives of the solder layers 105, 107 show opposite tendencies, so that the curves intersect each other. This point of intersection indicates the optimum life point. If the thickness of the copper base is selected in the vicinity of this intersection, the prolongation of the life of the semiconductor module can be achieved.

Figure 4:
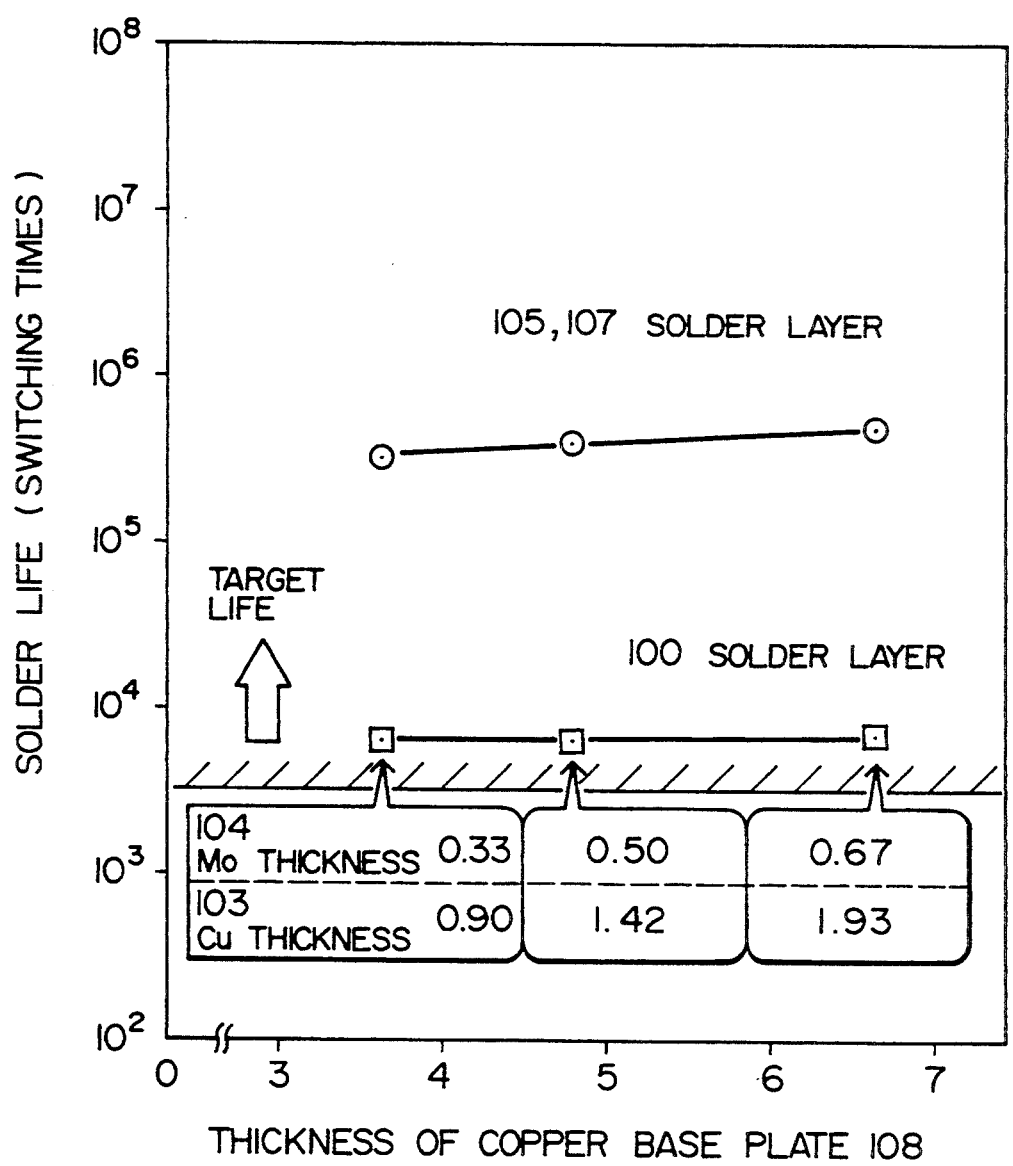
FIG. 4 is a diagram showing the relationship between the thickness of other heat sink plates and the solder life at the optimum life point determined by the thickness of the support base plate in the embodiment in FIG. 1.

FIG. 4 is a diagram showing the relationship between the thicknesses of other heat sink plates and the solder life at the optimum life point determined by the thickness of the copper base in the embodiment in FIG. 1. More specifically, FIG. 4 shows a result of study of the thickness of the heat sink plates 103, 104 at the optimum life point shown in FIG. 3 in response to the copper base thickness when the thickness of the copper base 108 is varied as the reference thickness of 1 with respect to the thickness of the heat sink plate 103 serving as the collector electrode in the embodiment shown in FIG. 1.

The heat sink plates 103, 104 have the optimum thicknesses corresponding to the varying thickness of the copper base 108, and the thickness of the copper base 108 is constantly more than 2.5 times in maximum thickness of the heat sink plate 103.

Also, the heat sink plates 103 and the copper base 108 existing on and beneath the insulating plate 106 have different thicknesses at all times. In this case, that heat sink plate beneath the insulating plate 106 also serves as the copper base 108. The thickness of each heat sink plate is not necessarily limited by the optimum life point, and it is obvious that each heat sink plate may have any thickness values so long as the thermal resistance is within the range limited by the working condition of the semiconductor module, shown in FIG. 4, for example.

Further, so long as the semiconductor module in the range of required service life, no problem arises if the semiconductor module structured in such a way that the balance of plate thicknesses is disturbed intentionally due to, for example, the limitations on the height of the semiconductor module.

Figure 5:
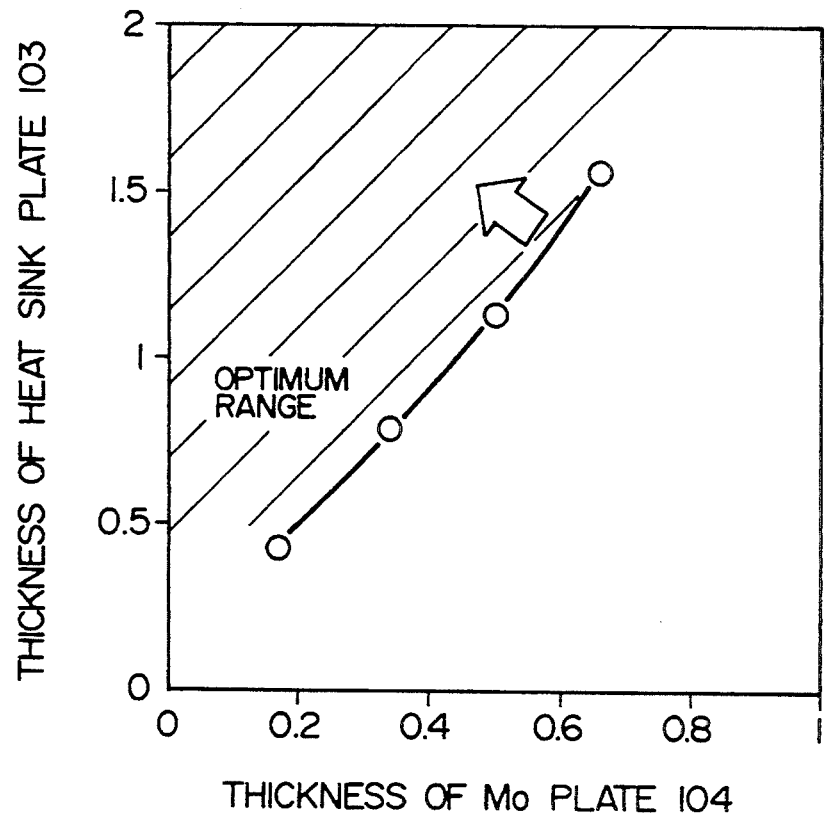
FIG. 5 is a diagram showing the relationship between the thickness of Mo plates and the thickness of the heat sink plate for preventing destruction of Si chips by thermal stress in the embodiment in FIG. 1.

FIG. 5 is a diagram showing the relationship between the thicknesses of the Mo plates and the heat sink plate 103 for preventing mechanically destructive stress from being applied to the Si chips in the embodiment in FIG. 1. More specifically, FIG. 5 represents the range of thicknesses of the Mo plates 104 as the initial heat sink plates and the intrinsic heat sink plate 103 to indicate the condition for preventing stresses greater than the destructive strength from being applied to the Si chips in the solder bonding or the subsequent resin molding process on the semiconductor module in a planar structure shown in FIG. 1 when the thickness of the intrinsic heat sink plate 103 used also as the collector electrode is considered as the reference thickness of 1. The thickness of the heat sink plate 103 is constantly more than twice in thickness of the Mo plates 104.

So long as this condition is met, in other words, if the thermal resistance is within the range limited by the working condition of the semiconductor module as shown in FIG. 5, no problem arises whichever range of plate thickness is selected. When a plurality of semiconductor chips are connected in parallel in the semiconductor module, it is possible to decrease the thickness of that portion of the Mo plate which is hard to cool, while the semiconductor chips generate heat to decrease the thermal resistance beneath certain semiconductor chips to thereby make uniform the thermal resistance of the whole semiconductor module, or it is possible to increase the thickness of the Mo plates beneath the semiconductor chips where a thermal change occurs violently within the range of the limited thermal resistance to keep a balance of the solder life in the whole semiconductor module.

Further, in this embodiment, for insulation between the collectors and the emitters and between the collectors and the gates of IGBTs on a semiconductor module, the emitter terminal insulating plate 112 and the gate terminal insulating plate 117 both made of $Al_2O_3$ are provided beneath the emitter and gate terminals 114 and 119. By this arrangement, the main dielectric resistance is secured by the through-thickness creeping distance. By this structure, the area of the semiconductor module can be decreased more than in the conventional semiconductor module which secures the dielectric strength by the flat surface creeping distance.

Moreover, in this structure, owing to the level difference between the Si chips and the above-mentioned terminals, the loop height of the Al wires 115 can be maintained, and the life of wire bonding can be prolonged effectively.

Figure 6:
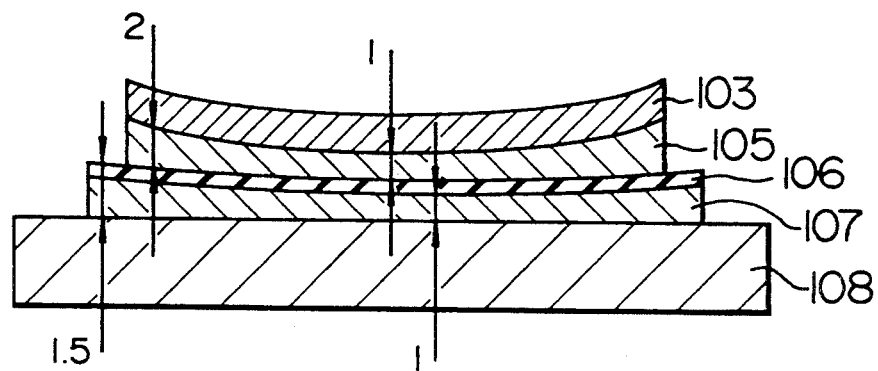
FIG. 6 is a diagram schematically showing the thicknesses of the solder layers bonding from the heat sink plate also serving as the collector electrode to the support base plate.

FIG. 6 is a diagram schematically showing the thicknesses of the solder layers bonding together the heat sink plate also serving as the collector electrode, the insulating plate 106, and the copper base 108. To be more specific, FIG. 6 schematically illustrates the thicknesses of the solder layers 105 and 107 for bonding from the heat sink plate 103 also serving as the collector electrode to the copper base 108.

The lives of the solder layers can be prolonged by increasing the layer thickness, but as the thickness increases, problems arise, such as the nonuniformity of the layers and an increase in the thermal resistance. In this embodiment, the heat sink plate 103 is warped, and the peripheral portion of the solder layer 105 is thickened 1.5 to 2 times greater in the middle portion.

Increasing the thickness of the solder layer, if carrying out right beneath the Si chips, directly results in an increased thermal resistance. On the other hand, even if the peripheral portion of the heat sink plate is given a greater thickness, the increase of the thermal resistance is very small. The life of the solder layer subjected to thermal fatigue is affected by a crack which starts from the peripheral portion of the solder layer. Therefore, by increasing the thickness of the peripheral portion of the layer, the extension of the crack can be suppressed effectively.

In this embodiment, the thickness of the insulating plate 106 is less than $\frac{1}{4}$ of the thickness of the heat sink plate 103. Consequently, the insulating plate 106 is allowed to warp in accordance with the amount of warp of the heat sink plate 103 when the solder bonding is performed, and the thicknesses of the solder layers 105 and 107 on and beneath the insulating plate 106 can be thickened to more than 1.5 times the thickness of the middle portion.

Figure 7:
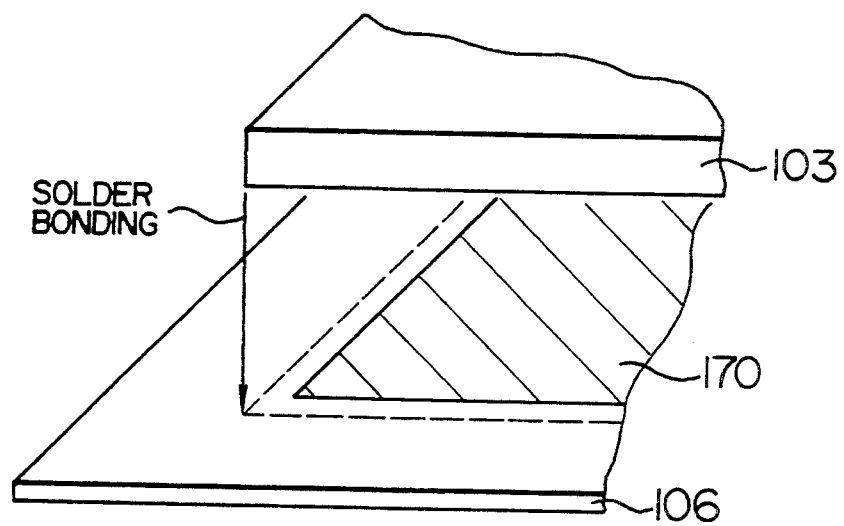
FIG. 7 is a diagram schematically showing how solder bonding is performed above a corner of the insulating plate.

FIG. 7 is a diagram schematically showing how solder bonding is carried out on a corner of the insulating plate. When the solder melts, the solder flows more quickly along the edge than on the flat surface of the plate. In solder bonding in this embodiment, there is a possibility that before the whole flat surface is wetted with solder, the solder flows along the edge and encircles only the peripheral portion. In this case, the residual gas inside the solder layer, having no gas outlet, causes voids to be formed in the solder layer.

In this embodiment, the metallization pattern 170 on the insulating plate 106 is about 1 mm smaller in size than the heat sink plate 103 to thereby prevent the molten solder from reaching the edge of the heat sink plate 103, so that a portion from which the residual gas can escape is secured, and the voids in the solder layer are reduced to less than 5%.

Figure 8:
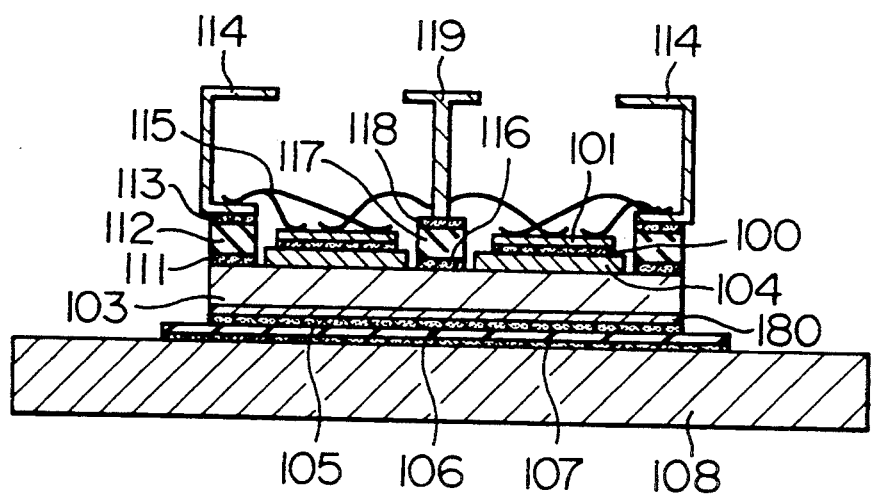
FIG. 8 is a diagram showing an embodiment in which a Mo plate is bonded to the support base plate side of the heat sink plate also serving as the collector terminal.

FIG. 8 is a diagram showing an embodiment in which a Mo plate is bonded to that side of the heat sink plate 103, also serving as the collector terminal, which faces the copper base 108 underneath. More specifically, FIG. 8 illustrates the embodiment in which a Mo plate 180 is bonded to that side of the heat sink plate 103, also serving as the collector terminal, which faces the copper base 108. When the thickness of the heat sink plate 103 is considered as the reference thickness of 1, for example, and the Mo plate 104 with a thickness of 0.43 is bonded to the heat sink plate 103 in the arrangement shown in the plan view of FIG. 2, if the solder bonded plates are cooled from the bonding temperature of about 810° C. to room temperature of about 25° C., the whole heat sink plate 103 warps toward the Mo plate 104 owing to a difference in thermal expansion coefficient.

In this embodiment, by simultaneously bonding the Mo plate 180 with a thickness of 0.03 under the heat sink plate 103, the amount of warp can be reduced to 200 μm or less at room temperature of about 25° C.

Figure 9:
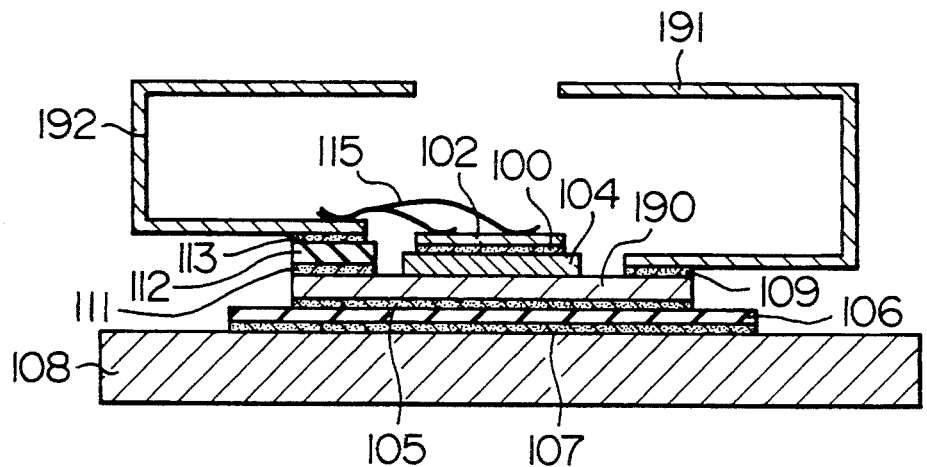
FIG. 9 is a diagram showing the cross-sectional structure of the semiconductor module having three Si chips mounted thereon.
Figure 10:
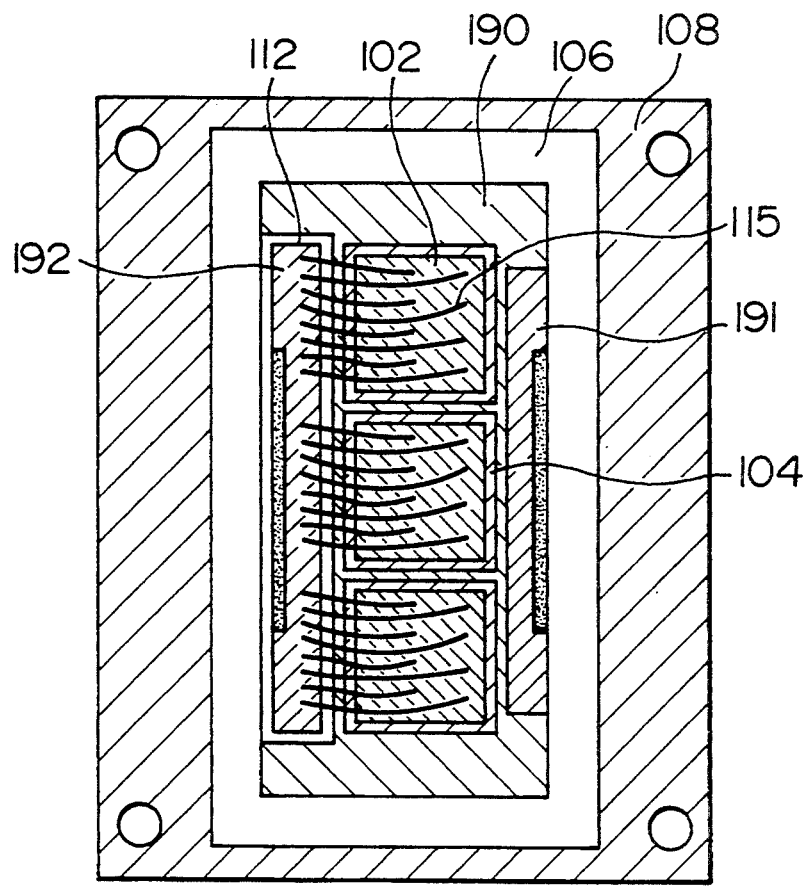
FIG. 10 is a plane view showing the arrangement of the Si chips and so on in the embodiment in FIG. 9.

FIG. 9 is a diagram showing a cross-sectional structure of the semiconductor module having three pieces of Si chips mounted thereon. FIG. 10 is a plane view showing the arrangement of Si chips and so on in the embodiment in FIG. 9. Also in this embodiment, the maximum thickness in the heat sink plates in the semiconductor module is considered as the reference thickness of 1, and three pieces of Si chips with a thickness of 0.1 are arranged dispersedly on a heat sink plate 190 made of Cu, for example, and serving also as the cathode electrode.

The three pieces of Si chips, that is, diode chips 102 are bonded to the heat sink plate 190 by a solder layer 100 with interposition of the Mo heat sink plate 104 with a thickness of 0.43, for example. The heat sink plate 190 is bonded to the insulating plate 106 of $Al_2O_3$ with a thickness of 0.2 by a solder layer 105. The insulating plate 106 is bonded to a copper base plate 108 with a thickness of 3.33 by a solder layer 107.

The cathode terminal 191 is bonded to the heat sink plate 190 also serving as the cathode electrode by a solder layer 109. The anode electrodes of the diode chips 102 are bonded to the anode terminal 192 by Al wires 115. The anode terminal 192 is bonded to the emitter terminal insulating plate 112 of $Al_2O_3$ with a thickness of 0.73, for example, by a solder layer 113. The emitter terminal insulating plate 112 is bonded to the cathode electrode 190 by a solder layer 111.

The grounds for determining the thicknesses of the heat sink plates, the insulating plates, and the copper base plate have been described with reference to FIGS. 3 to 5.

In this embodiment, if a 3 mm thick plate is used as the heat sink plate 103 for ease of handling a part with a little warp in the assembling process, even with a semiconductor module heretofore available on the market, which has fewer Si chips mounted thereon and a copper base area of about 40 $cm^2$, when the thermal resistance is less than the range limited by the object of usage, the service life can be prolonged by using a 8 mm or thicker base plate considering the thermal fatigue life. the service life can be prolonged. Further, if a support plate or copper base of 8 mm or thicker is used, it is possible to solve the problems, such as uneven mounting on cooling fins, which has occurred with a thin base plate and the increased contact thermal resistance between the fins and the base plate resulting from the warpage of the circuit board.

According to this invention, by using a support base plate or copper base which has a thickness 2.5 times greater than the thickness of the internal heat sink plates, the thermal fatigue lives of the bonding layers can be balanced to secure a prolonged life of the whole semiconductor module.

When the Mo plates are disposed under a plurality of semiconductor chips and a single copper heat sink plate is placed underneath, since the thickness of the copper heat sink plate is specified as more than twice thicker than the Mo plates, by striking a balance of the lives of the solder layers bonding the heat sink plates and the insulating plates in the semiconductor module, the whole semiconductor module can be prolonged.

Wheat is claimed is:

1. A semiconductor module including a plurality of semiconductor chips, an internal heat sink plate for supporting the semiconductor chips, and a base support plate separated from said heat sink plate by an insulating plate, wherein said semiconductor chips, said internal heat sink plate, said insulating plate and said base support plate are all bonded together by solder or metal brazing material, wherein the thickness of the base support plate is more than 2.5 times in maximum thickness of the internal support plate, wherein a Mo heat sink plate is disposed beneath each of said plurality of the semiconductor chips, said internal heat sink plate is disposed under said Mo plates and is comprised of a single copper plate, and the thickness of the internal copper plate heat sink plate is more than twice the thickness of said Mo plates.

2. A semiconductor module including a plurality of semiconductor chips, an internal heat sink plate for supporting the semiconductor chips, and a base support plate separated from said heat sink plate by an insulating plate, wherein said semiconductor chips, said internal heat sink plate, said insulating plate and said base support plate are all bonded together by solder or metal brazing material, wherein the thickness of the base support plate is more than 2.5 times in maximum thickness of the internal support plate, wherein said internal heat sink plate or the insulating plate is warped so that the middle portion of said internal heat sink plate is curved toward a solder layer so that the peripheral thickness of the solder layer is more than 1.5 times in thickness of the middle portion of the solder layer.

3. A semiconductor module including a plurality of semiconductor chips, an internal heat sink plate for supporting the semiconductor chips, and a base support plate separated from said heat sink plate by an insulating plate, wherein said semiconductor chips, said internal heat sink plate, said insulating plate and said base support plate are all bonded together by solder or metal brazing material, wherein the thickness of the base support plate is more than 2.5 times in maximum thickness of the internal support plate, wherein by forming plating layers on and beneath said insulating plate with the insertion of metallization patterns on either sides of the insulating plate, and bonding heat sink plates respectively to the upper and lower plating layers with the insertion of solder layers over the plating layers, the areas of said plating layers are made smaller than the areas of said heat sink plates disposed on and beneath said plating layers.

4. A semiconductor module including a plurality of semiconductor chips, an internal heat sink plate for supporting the semiconductor chips, and a base support plate separated from said heat sink plate by an insulating plate, wherein said semiconductor chips, said internal heat sink plate, said insulating plate and said base support plate are all bonded together by solder or metal brazing material, wherein the thickness of the base support plate is more than 2.5 times in maximum thickness of the internal support plate, wherein Mo heat sink plates are disposed beneath the semiconductor chips, wherein said internal heat sink plate comprises a Cu heat sink plate disposed beneath said Mo heat sink plates, and wherein an Mo heat sink plate is disposed on a side of said Cu heat sink plate which faces toward said base support plate.

5. A semiconductor module including a plurality of semiconductor chips, an internal heat sink plate for supporting the semiconductor chips, and a base support plate separated from said heat sink plate by an insulating plate, wherein said semiconductor chips, said internal heat sink plate, said insulating plate and said base support plate are all bonded together by solder or metal brazing material, wherein the thickness of the base support plate is more than 2.5 times in maximum thickness of the internal support plate, wherein when the area of the base support plate is 40 cm$^2$ or more, the thickness of said base support plate is 8 mm or more.

6. A semiconductor module including a plurality of semiconductor chips, an internal heat sink plate for supporting the semiconductor chips, and a base support plate separated from said heat sink plate by an insulating plate, wherein said semiconductor chips, said internal heat sink plate, said insulating plate and said base support plate are all bonded together by solder or metal brazing material, wherein the thickness of the base support plate is more than 2.5 times in maximum thickness of the internal support plate, wherein when a plurality of said semiconductor chips are bonded to said internal heat sink plate and a plurality of electrodes are wired between the semiconductor chips on the internal heat sink plate, a predetermined insulation distance between the terminals of the device is set in the through-thickness direction of said insulating plate disposed beneath the wires or the electrodes.

7. A semiconductor module, comprising:
an base support plate;
an insulating plate bonded on the base support plate;
a first heat sink plate bonded on the insulating plate;
a plurality of second heat sink plates bonded on the first heat sink plate; and
a plurality of semiconductor chips bonded on the plurality of second heat sink plates, wherein
a thickness of the base support plate is equal to 2.5 times or greater than that of the first heat sink plate and the thickness of the first heat sink plate is equal to 2.0 times or greater than that of at least one of the second heat sink plates.

8. A semiconductor module according to claim 7, wherein the first heat sink plate is comprised of copper and at least one of the second heat sink plates is comprised of molybdenum.

9. A semiconductor module according to claim 7, wherein the base support plate and the insulating plate, the insulating plate and the first heat sink plate, the first heat sink plate and the plurality of second heat sink plate, and the plurality of second heat sink plate and the plurality of semiconductor chips are respectively bonded together by one of solder and metal brazing material.

10. A semiconductor module according to claim 8, wherein the base support plate and the insulating plate, the insulating plate and the first heat sink plate, the first heat sink plate and the plurality of second heat sink plates, and the plurality of second heat sink plates and the plurality of semiconductor chips are respectively bonded together by one of solder and metal brazing material.

11. A semiconductor module according to claim 7, wherein a thickness of one of a solder and a metal brazing material around a peripheral portion of the insulating plate where the base support plate and the insulating plate are bonded as well as the insulating plate and the first heat sink plate, is equal to or greater than that of a middle portion of the insulating plate.

12. A semiconductor module according to claim 10, wherein a thickness of one of the solder and metal brazing material around a peripheral portion of the insulating plate where the base support plate and the insulating plate are bonded as well as the insulating plate and the first heat sink plate, is equal to or greater than that of a middle portion of the insulating plate.

13. A semiconductor module according to claim 9, wherein a thickness of one of the solder and metal brazing material around a peripheral portion of the insulating plate where the base support plate and the insulating plate are bonded as well as the insulating plate and the first heat sink plate, is equal to 1.5 times or greater than that of a middle portion of the insulating plate.

14. A semiconductor module according to claim 10, wherein a thickness of one of the solder and metal brazing material around a peripheral portion of the insulating plate where the base support plate and the insulating plate are bonded as well as the insulating plate and the first heat sink plate, is equal to 1.5 times or greater than that of a middle portion of the insulating plate.

15. A semiconductor module according to claim 9, further comprising: a metallizing layer formed on the insulating plate; and a plating layer formed on the insulating plate through the metallizing layer and having a smaller area than that of the first heat sink plate.

16. A semiconductor module according to claim 10, further comprising: a metallizing layer formed on the insulating plate; and a plating layer formed on the insulating plate through the metallizing layer and having a smaller area than that of the first heat sink plate.

17. A semiconductor module according to claim 7, further comprising a third heat sink plate located between the insulating plate and the first heat sink plate.

18. A semiconductor module according to claim 8, further comprising a third heat sink plate comprised of molybdenum located between the insulating plate and the first heat sink plate.

19. A semiconductor module according to claim 10, further comprising a third heat sink plate comprised of molybdenum located between the insulating plate and the first heat sink plate.

20. A semiconductor module according to claim 7, wherein an area of the base support plate is equal to or greater than 40 cm$^2$ and a thickness thereof is equal to or greater than 8 mm.

21. A semiconductor module according to claim 10, wherein an area of the base support plate is equal to or greater than 40 cm$^2$ and a thickness thereof is equal to or greater than 8 mm.

22. A semiconductor module according to claim 7, further comprising: an insulating substance bonded on the first heat sink plate; an electrode bonded on the insulating substance; and a wiring connected between the electrode and at least one of the semiconductor chips.

23. A semiconductor module according to claim 10, further comprising: an insulating substance bonded on the first heat sink plate; an electrode bonded on the insulating substance; and a wiring connected between the electrode and at least one of the semiconductor chips.

24. A semiconductor module according to claim 7, wherein a thickness of at least one of the second heat sink plates is greater or equal to that of at least one of the semiconductor chips.

25. A semiconductor module according to claim 10, wherein a thickness of at least one of the second heat sink plates is greater or equal to that of at least one of the semiconductor chips.

26. A semiconductor module, comprising:
a base support plate;
an insulating plate bonded on the base support plate;
a first heat sink plate bonded on the insulating plate;
a second heat sink plate bonded on the first heat sink plate; and
a semiconductor chip bonded on the second heat sink plate, wherein
a thickness of the base support plate is equal to 2.5 times or greater than that of the first heat sink plate and the thickness of the first heat sink plate is equal to 2.0 times or greater than that of the second heat sink plate.

* * * * *